(12) United States Patent
Groepl et al.

(10) Patent No.: US 8,855,154 B2
(45) Date of Patent: Oct. 7, 2014

(54) CIRCUIT AND METHOD FOR CONTROLLING LIGHT-EMITTING COMPONENTS

(75) Inventors: Martin Groepl, Sonthofen/Oberallgaeu (DE); Holger Hoeltke, Munich (DE)

(73) Assignee: SILICON LINE GmbH, München (DE)

( * ) Notice: Subject to any disclaimer, the term of this patent is extended or adjusted under 35 U.S.C. 154(b) by 0 days.

(21) Appl. No.: 12/654,515

(22) Filed: Dec. 22, 2009

(65) Prior Publication Data

US 2010/0172385 A1 Jul. 8, 2010

Related U.S. Application Data

(63) Continuation of application No. PCT/EP2008/057785, filed on Jun. 19, 2008.

(30) Foreign Application Priority Data

Jun. 19, 2007 (DE) .......... 10 2007 028 576
Aug. 24, 2007 (DE) .......... 10 2007 040 151
Apr. 29, 2008 (DE) .......... 10 2008 001 453

(51) Int. Cl.
*H01S 3/00* (2006.01)
*H05B 33/08* (2006.01)

(52) U.S. Cl.
CPC .......... *H05B 33/0818* (2013.01); *Y02B 20/347* (2013.01)
USPC .................. 372/38.02; 372/38.03; 372/38.04; 372/38.07; 372/29.014; 372/29.015; 315/291

(58) Field of Classification Search
USPC ........ 372/38.04, 38.02, 38.03, 38.07, 29.014, 372/29.015
See application file for complete search history.

(56) References Cited

U.S. PATENT DOCUMENTS 5,012,384 A   4/1991   Chew
5,019,769 A   5/1991   Levinson
(Continued)

FOREIGN PATENT DOCUMENTS

DE  10 2004 032456 B3   4/2006
EP       0 798 828 A   10/1997
(Continued)

OTHER PUBLICATIONS

U.S. Appl. No. 12/654,514, filed Dec. 2009, Groepl.
(Continued)

*Primary Examiner* — Tod T Van Roy
(74) *Attorney, Agent, or Firm* — Shlesinger, Arkwright & Garvey LLP (57) ABSTRACT

Circuit arrangement or circuit, in particular driver circuit, and a method for controlling at least one light-emitting component, such as an electro-optical transducer, a light-emitting diode (LED), an electroluminescent diode, a laser, or a semiconductor laser, by switching a switching element between a first switching position and a second switching position, and the voltage supply is effected by a supply element, such as a voltage source or a current source supported by a decoupling capacitor on the output side, so that current drain and output resistance are as low as possible, so that the highest possible frequency or switching speed as well as the highest possible output voltage for the light-emitting component can be achieved, the light-emitting component is controlled by varying its operating voltage, in particular by switching between the switching positions, and the first and second switching positions are of low impedance for the operating frequency.

8 Claims, 5 Drawing Sheets

(56) References Cited

U.S. PATENT DOCUMENTS

| | | | |
|---|---|---|---|
| 5,672,994 A | 9/1997 | Au et al. | |
| 5,834,813 A | 11/1998 | Ma et al. | |
| 5,949,253 A | 9/1999 | Bridgewater, Jr. | |
| 6,031,855 A | 2/2000 | Watanabe | |
| 6,650,143 B1 | 11/2003 | Peng | |
| 6,667,661 B1 | 12/2003 | Liu et al. | |
| 6,812,733 B1 | 11/2004 | Plasterer et al. | |
| 6,965,722 B1 | 11/2005 | Nguyen | |
| 6,975,135 B1 | 12/2005 | Bui | |
| 6,990,130 B2 * | 1/2006 | Sato et al. | 372/38.02 |
| 7,133,429 B2 | 11/2006 | Moran | |
| 7,154,923 B2 | 12/2006 | Kucharski | |
| 7,173,851 B1 | 2/2007 | Callahan et al. | |
| 7,272,067 B1 | 9/2007 | Huang et al. | |
| 7,280,425 B2 | 10/2007 | Keshavarzi et al. | |
| 7,595,661 B2 | 9/2009 | Kim | |
| 8,194,431 B2 | 6/2012 | Groepl et al. | |
| 8,258,813 B2 | 9/2012 | Groepl et al. | |
| 2001/0043093 A1 | 11/2001 | Sakura et al. | |
| 2002/0117724 A1 | 8/2002 | Ariyoshi et al. | |
| 2003/0058725 A1 | 3/2003 | Bell | |
| 2003/0094977 A1 | 5/2003 | Li et al. | |
| 2004/0101007 A1 * | 5/2004 | Bozso et al. | 372/38.02 |
| 2004/0160996 A1 * | 8/2004 | Giorgi et al. | 372/25 |
| 2004/0195978 A1 | 10/2004 | Horiuchi et al. | |
| 2004/0208011 A1 | 10/2004 | Horiuchi et al. | |
| 2005/0185428 A1 | 8/2005 | Crawford et al. | |
| 2005/0231459 A1 | 10/2005 | Furukawa | |
| 2005/0259703 A1 * | 11/2005 | You et al. | 372/38.07 |
| 2006/0133435 A1 * | 6/2006 | Ikeda | 372/38.02 |
| 2007/0159434 A1 | 7/2007 | Yen et al. | |
| 2007/0291807 A1 * | 12/2007 | Uesaka | 372/38.04 |
| 2008/0007985 A1 | 1/2008 | Wilcox | |
| 2008/0012507 A1 | 1/2008 | Nalbant | |
| 2008/0154103 A1 | 6/2008 | LeMay | |
| 2008/0304527 A1 | 12/2008 | Gao et al. | |

FOREIGN PATENT DOCUMENTS

| | | |
|---|---|---|
| EP | 1 777 708 A1 | 4/2007 |
| EP | 1 816 723 | 8/2007 |
| FR | 2 889 643 A | 2/2007 |
| GB | 2 365 788 | 2/2002 |
| WO | WO2007/069104 A | 6/2007 |
| WO | WO2008/050779 A | 5/2008 |

OTHER PUBLICATIONS

U.S. Appl. No. 12/654,951, filed Jan. 2010, Groepl et al.
PCT Written Opinion, dated Jan. 12, 2010 in PCT/EP2008/057785, filed Jun. 19, 2008 (7 pages).
U.S. Appl. No. 12/901,515, filed Oct. 2010, Groepl et al.
U.S. Appl. No. 12/950,766, filed Nov. 2010, Groepl et al.
U.S. Appl. No. 13/083,282, filed Apr. 2011, Groepl et al.
PCT International Search Report (ISR) in PCT/EP2008/057785, dated Oct. 7, 2008 (6 pages).

* cited by examiner

CIRCUIT AND METHOD FOR CONTROLLING LIGHT-EMITTING COMPONENTS

CROSS-REFERENCE TO RELATED APPLICATIONS

This application is a continuation of application no. PCT/EP2008/057785, filed Jun. 19, 2008, which claims the priority of German application no. 10 2007 028 576.2, filed Jun. 19, 2007, and which application no. PCT/EP2008/057785, filed Jun. 19, 2008, claims the priority of German application no. 10 2007 040 151.7, filed Aug. 24, 2007, and which application no. PCT/EP2008/057785, filed Jun. 19, 2008, claims the priority of German application no. 10 2008 001 453.2, filed Apr. 29, 2008, and each of which is incorporated herein by reference.

FIELD OF THE INVENTION

The present invention relates generally to the technical field of controlling light-emitting components.

The present invention relates more specifically to a circuit arrangement or circuit, in particular a driver circuit, and a method for controlling at least one light-emitting component.

Within the scope of the present invention, the term light or light-emitting is understood not only as the range of electromagnetic radiation visible to the eye, extending in a wavelength range from about 380 nanometers to about 780 nanometers (which corresponds to a frequency of about 789 terahertz down to about 385 terahertz).

Rather, the term light or light-emitting is understood as the entire electromagnetic wavelength or frequency spectrum, including the spectrum not visible to the eye, in particular the I[nfra]R[ed] range (wavelength range up to about 2,000 nanometers or frequency range down to about 150 terahertz), for example a wavelength of about 850 nanometers or a frequency of about 350 terahertz.

BACKGROUND OF THE INVENTION

Figure 5A:
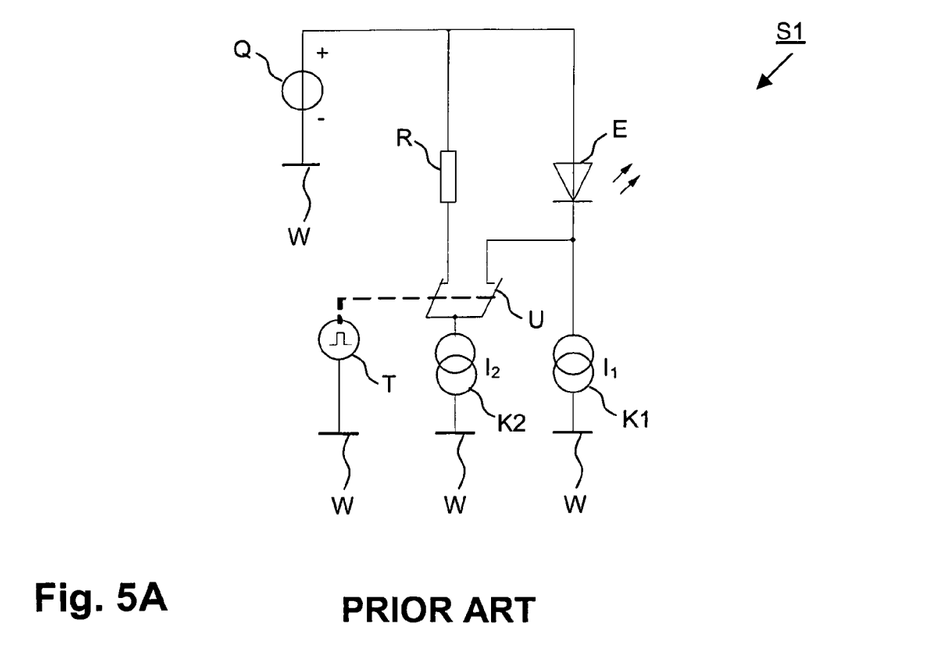
FIG. 5A in a schematic diagram a first exemplary embodiment of a circuit arrangement according to the PRIOR ART.
Figure 5B:
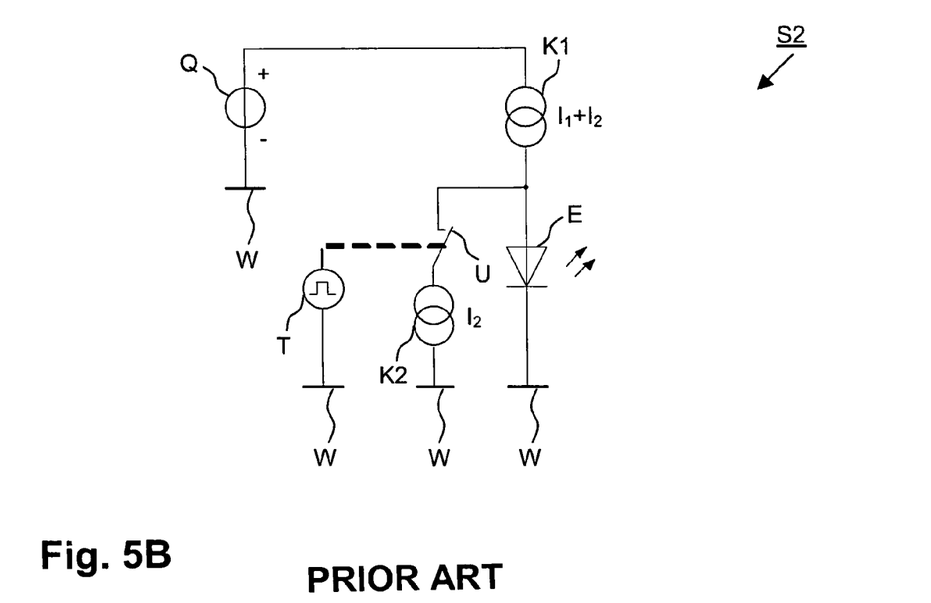
FIG. 5B in a schematic diagram a second exemplary embodiment of a circuit arrangement according to the PRIOR ART.
Figure 5C:
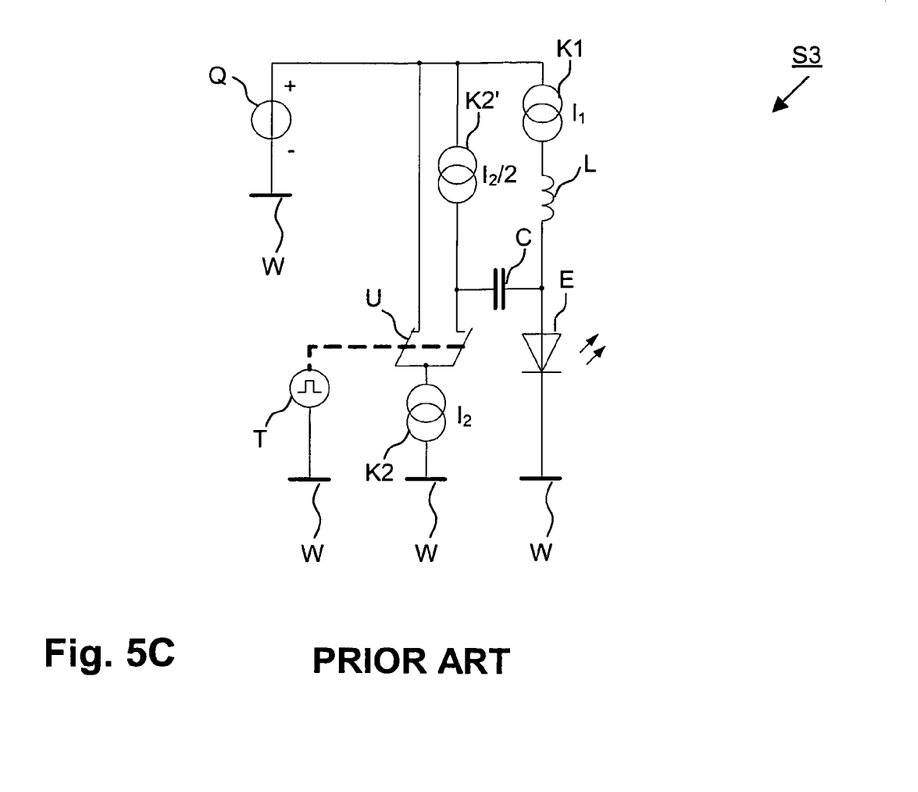
FIG. 5C in a schematic diagram a third exemplary embodiment of a circuit arrangement according to the PRIOR ART.

Exemplary circuit arrangements known from the PRIOR ART for controlling a light-emitting component E for the purposes of data transmission from the light-emitting component E (=so-called source) to a light-receiving component (=so-called sink) are shown in FIG. 5A to FIG. 5C.

Typically, a semiconductor laser or an electroluminescent diode is used as light-emitting component E, in particular as an optical transmitting element or as an optical source, for optical data transmission.

This semiconductor laser or this electroluminescent diode is, according to the prior art, for example supplied by an electronic driver circuit S1 (cf. FIG. 5a), S2 (cf. FIG. 5B) or S3 (cf. FIG. 5C) with the necessary operating voltage, the bias current and the modulation current for correct operation.

The driver circuit S1, S2, S3 can be constructed both as an integrated circuit (or IC=Integrated Circuit) and also discretely from individual components on a printed circuit board (or PCB=Printed Circuit Board).

In the example from the prior art shown in FIG. 5A, the light-emitting component E can be powered via a first current path $I_1$ and additionally via a second current path $I_2$. For this purpose in the first current path the current $I_1$ flows from a DC voltage source Q via the light-emitting component E to a constant current source K1 for $I_1$.

By switching to active or switching on the second current path $I_2$ by means of a switch U which controls the current level of the light-emitting component E, the entire current $I_{ges}=I_1+I_2$ flows through the light-emitting component E, otherwise the current $I_1$. A constant current source K2 is provided for the power supply of the second current path $I_2$.

The modulation of the light-emitting component E is thus effected in the form of current adjustment or current modulation, that is by temporally varying the current intensities flowing through the light-emitting component E between the values $I_1$ and $I_1+I_2$.

The arrangement of switch U and dummy load R has the effect that at the switch U the same current always flows in relation to the node point assigned to the second current path $I_2$, wherein when the second current path $I_2$ is not switched to the light-emitting component E, the current $I_2$ in the dummy load R is substantially converted into thermal energy which can, for example, be up to about fifty percent of the operating time of the light-emitting component; however, the current $I_2$ is disadvantageously also present when this current $I_2$ is no longer needed.

Furthermore, in the example from the prior art shown in FIG. 5A, the two constant current sources K1 and K2 are arranged in the high-frequency path which necessarily involves parasitic capacitances. Also in the example from the prior art shown in FIG. 5A, an undesirable high voltage drop or a high saturation voltage necessarily occur.

In the second exemplary driver circuit S2 according to the prior art shown in FIG. 5B, when the second current path $I_2$ is switched to active or switched on, the current $I_1+I_2$ flows through the light-emitting component E by means of the switch U which controls the current level, otherwise the current $I_1$; however, the current $I_2$ is disadvantageously also present when this current $I_2$ is no longer needed.

The operating voltage of the light-emitting component E depends on the supply voltage supplied by the voltage source Q (=for example about three volts) and on the constant current source K1 or on the constant current sources K1, K2.

In the third exemplary driver circuit S3 according to the prior art shown in FIG. 5C, either the current $I_1+0.5I_2$ or the current $I_1-0.5I_2$, which results in a current difference of $I_2$, flows through the light-emitting component E depending on the position of the switch U which controls the current level.

The arrangement of a (not obligatory) inductor L at which, for example, a voltage loss of about 0.5 volt occurs, is usually used to increase the impedance of the constant current source K1 at high frequencies and consequently makes it possible to use a constant current source K1 which does not have a high output impedance at high frequencies.

In addition to the previously described driver circuit S3, a driver circuit with inductor is also known from the prior art document U.S. Pat. No. 6,667,661 B1.

In the electronic driver circuit S3 shown in FIG. 5C, it is disadvantageously necessary to provide external components, that is, disposed outside the integrated circuit, such as a capacitor C.

As a result of the arrangement of inductor L and capacitor C, undesirable electromagnetic interference effects such as electromagnetic oscillations can furthermore occur. In this connection, for example, the prior art document U.S. Pat. No. 7,133,429 B2 is concerned with the problem of avoiding electromagnetic oscillations of a laser driver circuit with signal-amplified data transmission.

Another disadvantage of conventional circuit arrangements is their high voltage drop across the components in series with the light-emitting component. Particularly for applications in which only a small supply voltage is available, this conflicts with the aim of providing the highest possible operating voltage at the light-emitting component.

The technical formulation of the problem of providing a driver circuit for optical data transmission with low power drain is known, for example, from the prior art documents U.S. Pat. Nos. 6,965,722 B1 and 7,154,923 B2. However, the structure of the driver circuits described in these documents is very complex.

In addition, circuit arrangements known from the prior art disadvantageously have high output resistances (=real parts of the output impedances). This limits the speed, in particular for the transient ringing (or settling) or the circuit arrangement since the maximum switching frequency f behaves substantially reciprocally proportional to the product of the total capacitance C and total resistance R at the output of the controlling or driver circuit, wherein the total capacitance C, for example, is substantially dominated by the parasitic capacitive effect of the light-emitting component and the total resistance R is substantially given by the parallel circuit of the output resistance of the driver circuit and the input resistance of the light-emitting component.

Finally, another technical problem of conventional circuit arrangements is a (too) low output voltage at the light-emitting component since the constant current source(s) require(s) a voltage (drop) of, for example, about 0.5 volt (a small voltage drop in the order of, for example, about 0.2 volt also occurs at the voltage source providing the supply voltage as long as this is a regulated voltage source).

Another small voltage drop in the order of, for example, about 0.1 volt occurs at the switching element U so that (too) little voltage occurs across the light-emitting component and therefore (too) little voltage is available at the light-emitting component.

OBJECTS AND SUMMARY OF THE INVENTION

Starting from the previously outlined disadvantages and inadequacies and acknowledging the outlined prior art, it is the object of the present invention to further develop a circuit arrangement of the type specified initially and a method of the type specified initially so that the previously outlined disadvantages and inadequacies are avoided; in particular current drain and output resistance should be as low as possible so that the highest possible frequency or switching speed as well as the highest possible output voltage for the light-emitting component can be achieved.

This object is achieved by a circuit arrangement having the features specified and by a method having the features specified.

The light-emitting component is supplied with a first operating voltage in the first switching position of the switching element, supplied with a second operating voltage in the second switching position of the switching element and controlled by switching between the first operating voltage and the second operating voltage; in particular the light-emitting element is controlled by switching between the switching positions of which at least the first switching position of the switching element and the second switching position of the switching element are of low impedance for the operating frequency.

The switching element is expediently configured as at least one closing switch or at least one reversing switch or as at least one changeover switch, for example, as at least one switching transistor such as for example as at least one M[etal]O[xide]S[emiconductor]F[ield]E[ffect]T[ransistor].

In this way, at least two operating states of the circuit arrangement with low impedances in each case, in particular without further current losses, can be achieved.

A supply element in the sense of the present invention can, for example, be achieved as at least one voltage source or as a combination of current source and decoupling capacitor so that a low output impedance is produced for the relevant operating frequencies.

The light-emitting component can thus be controlled by varying its operating voltage by means of switching the voltage the light-emitting element is supplied with, in particular the voltage entering into the light-emitting component, and can, for example, be used for optical data transmission. For this purpose, the light-emitting component converts electrical signals into optical signals which are coupled into an optical waveguide, for example, into a glass fiber or into a plastic fiber.

In the present invention, the light-emitting component is therefore voltage-driven in at least two operating points which can be configured by means of the switching element and optionally by means of at least one control device, in particular signal source, for controlling the switching element.

The circuit arrangement according to the invention is particularly advantageous on account of its low power drain. The power drain is particularly low because, unlike the prior art, there is no other current path outside the light-emitting component.

Furthermore, in the present invention the person skilled in the art will particularly appreciate the comparatively high output voltage available for the light-emitting component.

Furthermore, the low output impedance is a further advantage of the present invention. This makes it possible to achieve a high speed, particularly for the settling of the circuit arrangement since the maximum switching frequency f behaves substantially reciprocally proportional to the product of the total capacitance C and total resistance R at the output of the controlling or driver circuit, wherein the total capacitance C, for example, is substantially dominated by the parasitic capacitive effect of the light-emitting component and the total resistance R is substantially given by the parallel circuit of the output resistance of the driver circuit and the input resistance of the light-emitting component.

The light-emitting component can in particular be an electro-optical transducer, for example a light-emitting diode (=L[ight]E[mitting]D[iode]), such as an electroluminescent diode, or a laser (=Light Amplification by Stimulated Emission of Radiation), such as a semiconductor laser.

The controlling of the light-emitting component is effected, for example, for the purposes of data transmission from at least one light-emitting component (=so-called source) to at least one light-receiving component (=so-called sink).

The data transmission can take place, for example, via at least one carrier medium such as via glass fibers or via plastic fibers or also via air as carrier medium or through vacuum.

The present invention finally relates to the use of at least one circuit arrangement, in particular of at least one driver circuit, according to the type presented hereinbefore and/or of a method according to the type presented hereinbefore in at least one, in particular mobile, telecommunication system, for example in at least one communication device, such as in at least one mobile telephone, in at least one, in particular mobile, data communication system or in at least one, in particular mobile, data processing device, for example in at least one handheld, in at least one notebook or in at least one P[ersonla]D[igital]A[ssistant], in at least one, in particular mobile, data recording and/or reproducing device, for example in at least one camcorder, in at least one digital camera or in at least one H[igh]D[efinition]T[ele]V[ision] or in at least one transportation means, for example in at least one driver assistance system or in at least one navigation system of an automobile.

In a mobile communication device or in a mobile data processing device, the present invention can be used particularly advantageously since in these areas of application, the supply voltage provided by the battery or by the rechargeable battery unit, in everyday language accumulator, is limited; in the sense of the longest possible operating time of the rechargeable battery, the efficient dealing with the supply voltage and the power uptake made possible by the present invention is of particular benefit.

As a result, by controlling the light-emitting component by means of switching its operating voltage, that is by the present voltage-driven approach according to the present invention, a very low output impedance and therefore a very high frequency or switching speed can be achieved.

The person skilled in the art in the technical field of controlling light-emitting components will particularly appreciate that the circuit arrangement according to the present invention and also the method according to the present invention have both a low output impedance and a low energy drain.

As has already been discussed hereinbefore, there are various possibilities for configuring and further developing the teaching of the present invention in an advantageous manner. For this purpose, reference is made to the further embodiments, features and advantages of the present invention explained in detail hereinafter inter alia with reference to the exemplary embodiments illustrated by FIG. 1 to FIG. 4C.

BRIEF DESCRIPTION OF THE DRAWINGS

It is shown in.

DETAILED DESCRIPTION OF THE INVENTION

The same or similar embodiments, elements or features are provided with identical reference numerals in FIG. 1 to FIG. 5C.

Figure 1:
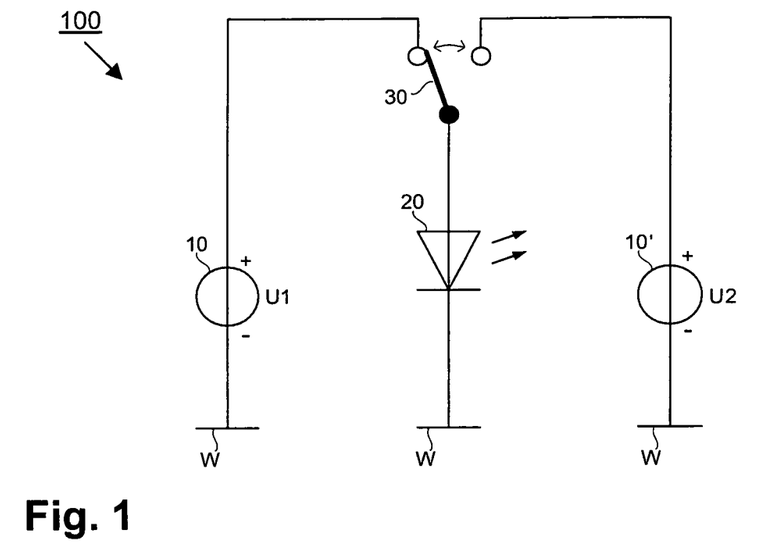
FIG. 1 in a schematic diagram a first exemplary embodiment of a circuit arrangement according to the present invention operating according to the method of the present invention.
Figure 2:
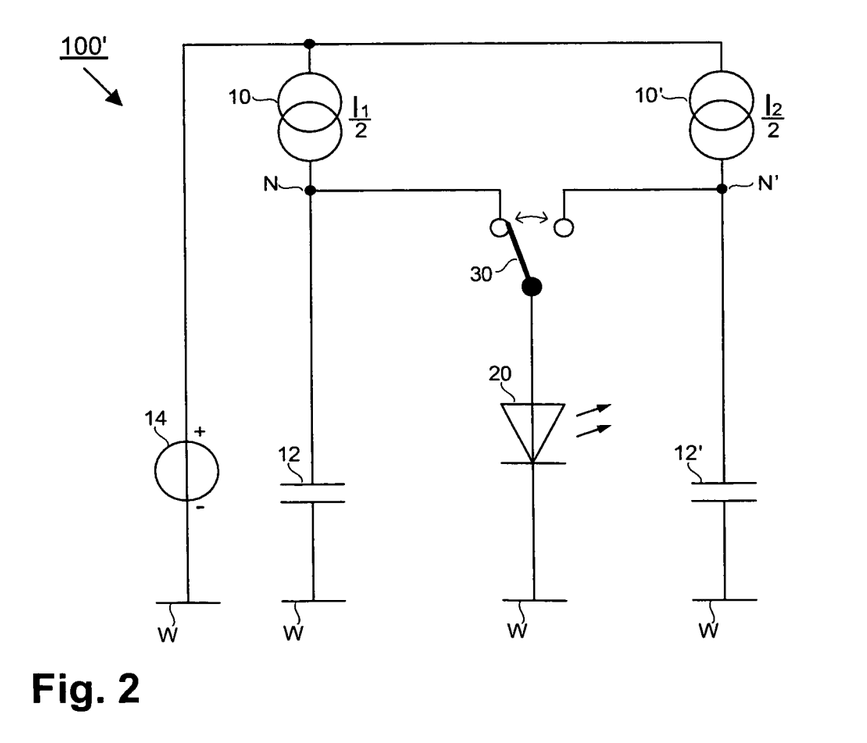
FIG. 2 in a schematic diagram a second exemplary embodiment of a circuit arrangement according to the present invention operating according to the method of the present invention.
Figure 3:
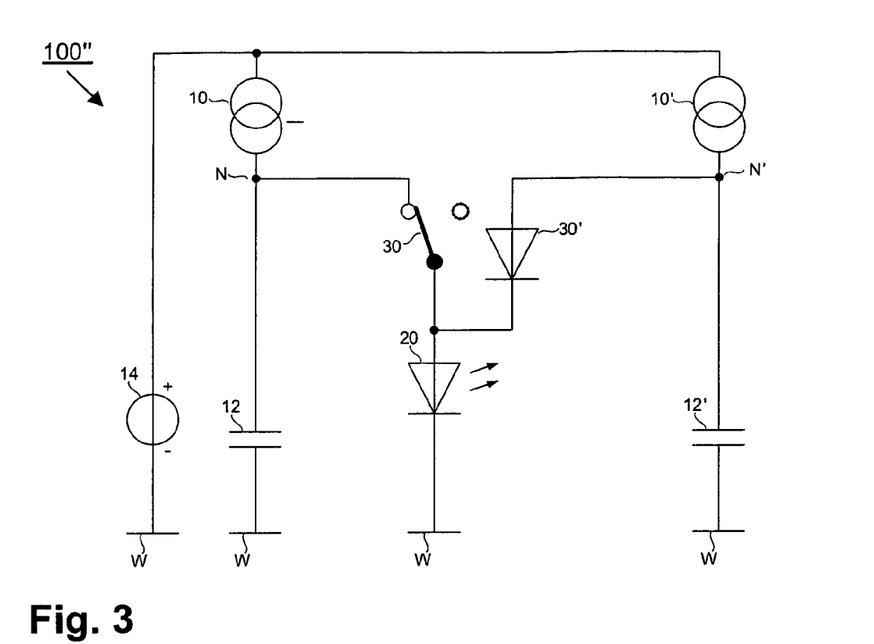
FIG. 3 in a schematic diagram a third exemplary embodiment of a circuit arrangement according to the present invention operating according to the method of the present invention.
Figure 4A:
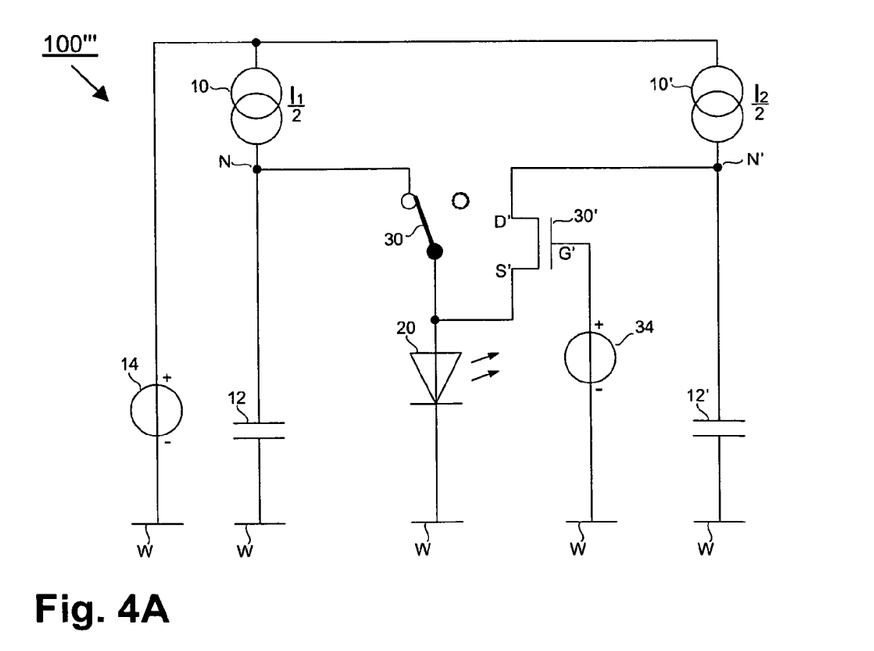
FIG. 4A in a schematic diagram a fourth exemplary embodiment of a circuit arrangement according to the present invention operating according to the method of the present invention.
Figure 4B:
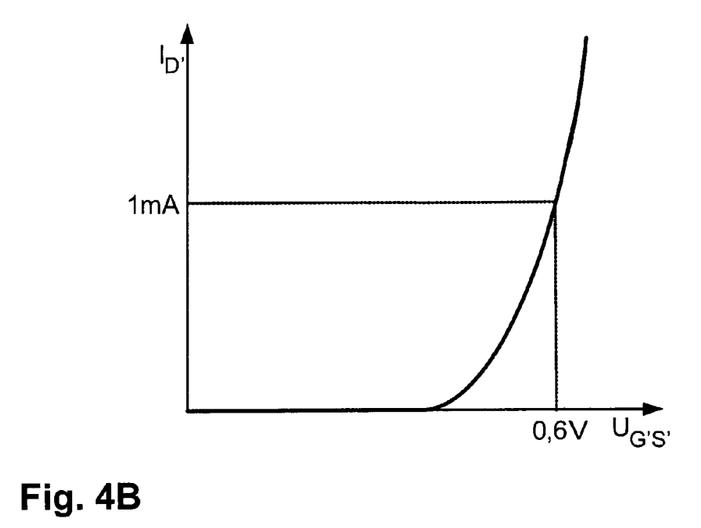
FIG. 4B in a diagrammatic view the drain current characteristic plotted versus the gate source voltage for the transistor contained in the circuit arrangement from FIG. 4A.
Figure 4C:
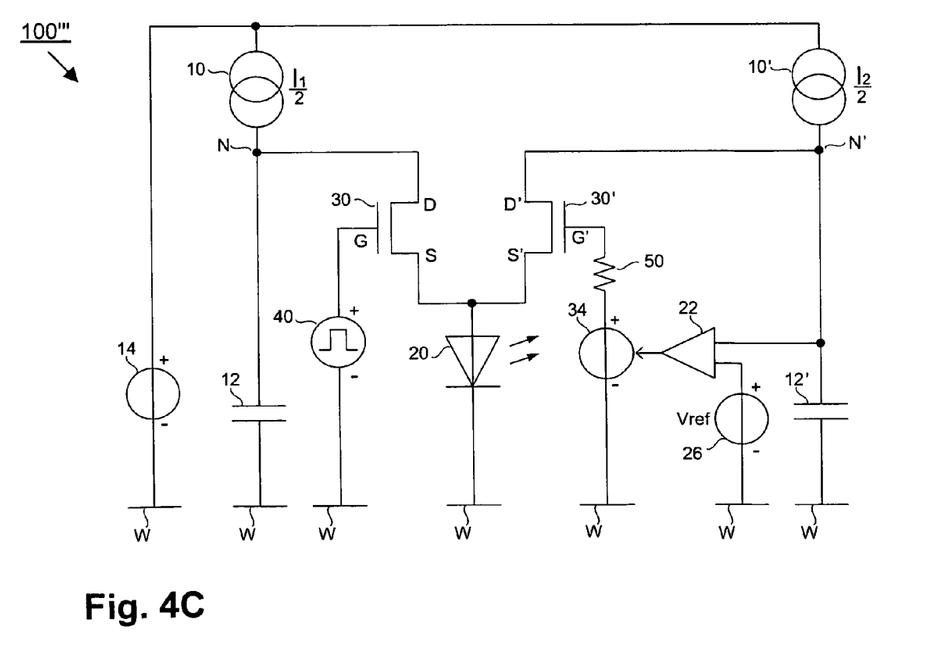
FIG. 4C in a schematic detail view a variant of the circuit arrangement from FIG. 4A comprising two transistors.

In order to avoid superfluous repetitions, the following explanations regarding the embodiments, features and advantages of the present invention—unless specified otherwise—relate both to the first exemplary embodiment of a circuit arrangement 100 shown in FIG. 1 also to the second exemplary embodiment of a circuit arrangement 100' shown in FIG. 2 also to the third exemplary embodiment of a circuit arrangement 100" shown in FIG. 3 and also to the fourth exemplary embodiment of a circuit arrangement 100''' shown in FIG. 4A, in FIG. 4B and in FIG. 4C.

In the first exemplary embodiment (basic concept) of the present invention illustrated by reference to FIG. 1, a circuit arrangement 100 is shown, i.e. a controlling circuit or driver circuit, for controlling a light-emitting component 20, for example a light-emitting diode (=L[ight]E[mitting]D[iode]) or electroluminescent diode or a laser, for example a semiconductor laser.

In addition to the light-emitting component 20, the circuit 100 comprises two supply elements in the form of voltage sources 10 or 10' (rechargeable battery unit) operated towards a reference potential W, in particular towards earth potential or ground potential or zero potential, for the supply of the circuit arrangement 100 with a first operating voltage $U_1$ or with a second operating voltage $U_2$.

As shown in FIG. 1, the circuit arrangement 100 is further assigned a switching element 30, in particular a reversing switch or changeover switch, for example, for each switching position a switching transistor such as a M[etal]O[xide]S[emiconductor]F[ield]E[ffect]T[ransistor] in each case.

This switching element 30 is configured for controlling the light-emitting component 20 by means of switching at least between a first switching position and a second switching position.

In this case, in the first switching position of the switching element 30, the entire or almost the entire voltage $U_1$ provided by the first voltage source 10 drops across the light-emitting component 20; as an example, in the first switching position of the switching element 30 at least about ninety percent, for example about 99 percent, of the voltage provided by the first voltage source 10 can drop across the light-emitting component 20.

On the other hand, in the second switching position of the switching element 30, the entire or almost the entire voltage $U_2$ provided by the second voltage source 10' drops across the light-emitting component 20; as an example, in the second switching position of the switching element 30 at least about ninety percent, for example about 99 percent, of the voltage provided by the second voltage source 10' can drop across the light-emitting component 20.

The circuit arrangement 100' according to the second exemplary embodiment of the present invention illustrated by reference to FIG. 2 comprises two current sources 10 or 10' connected in parallel to one another as supply elements, their outputs each being supported by a capacitor by means of a decoupling capacitor 12 or 12'.

For supplying the supply voltage 14 (so-called Thévenin voltage), for example of the order of magnitude of about three volts, the circuit arrangement 100' comprises a supply element in the form of a battery.

As shown in FIG. 2, the supply element can be configured as a current source supported by a decoupling capacitor on the output side, possibly as a combination or interconnection of current sources 10, 10' optimized for applications at low frequencies and decoupling capacitor 12, 12'.

In this case, the current source 10 or 10' is used for tracking the current as required. The decoupling capacitor 12 or 12' is used for reducing the impedance of the node N or N' for the range of switching and operating frequencies of the driver circuit 100'.

Since an increase in the capacitance at the node point N or N' advantageously acts on the decoupling effect at this node point N or N', no upper limit for its parasitic output capacitance is to be noted when dimensioning the current source 10 or 10' since the embodiment according to FIG. 2 is insensitive to parasitic capacitances.

As a result, the current source 10 or 10' can be dimensioned such that it operates as prescribed even with a very small voltage difference between the supply voltage 14 and the voltage at the node point N or N'.

In the first switching position of the switching element 30, the light-emitting component 20 is connected to the node point N at which an exemplary voltage of about 2.8 volt is applied. In the second switching position of the switching element 30, the light-emitting component 20 is connected to the node point N' at which an exemplary voltage of about 2.3 volt is applied.

In this case, the node point N or N' connecting the output of the current source 10 or 10' and the first or second switching position of the switching element 30 is supported by the decoupling capacitor 12 or 12' in a high-capacitance manner and substantially "not moved" with the signal to be transmitted, that is it is constant.

Taking into account an exemplary voltage loss at the switching element 30 in the order of, for example, 0.1 volt, high-frequency signals alternating between about 2.7 volt and about 2.2 volt are in this way possible at the light-emitting component 20 since a delimitation or separation between the low-frequency branch of the current source 10, 10' and the high-frequency branch of the light-emitting component 20 is brought about "on both sides" by the capacitive support of the node N or N'.

This advantageously has the effect that the low-capacitance and small-area reversing switch 30 makes effectively no capacitive contribution and makes possible a high-frequency, i.e. very fast, switching between the two substantially static states.

As a result, the circuit arrangement 100' according to the second exemplary embodiment illustrated by reference to FIG. 2 allows particularly effective use of the supply voltage 14 and the possibility of modification for the current intensities $0.5 I_1$ or $0.5 I_2$ provided by the current sources 10 or 10' (→switching between the current intensity $I_1$ at the light-emitting component 20 in the first switching position and the current intensity $I_2$ at the light-emitting component 20 in the second switching position insofar as an activation of both switching positions uniformly distributed over the time average exists).

In the driver circuit 100' the output impedance can also be kept very low at high frequencies since this output impedance is merely limited by the parasitic resistance of the switching element 30 so that a very high operating frequency or switching speed can be achieved.

In the particular case of the present invention, a very high output voltage can be achieved for the light-emitting component 20 since only a very small voltage drop occurs via the switch 30; in addition, the current source 10, 10' is advantageously disposed in the supply path and not in the high-frequency signal path.

In the circuit arrangement 100" according to the third exemplary embodiment of the present invention illustrated by reference to FIG. 3, a diode 30' polarized in the forward direction, in particular towards the second switching position of the switching element 30, for example, a pn diode or a Schottky diode, is switched between the second node point N' and the second switching position of the switching element 30. This diode 30' conducts in the forward direction, that is toward the switching element 30, and blocks in the rearward direction.

By using such a diode 30' switched between the node N' and the input of the light-emitting component 20 as the second component of the switching element 30, a simplification of the same is achieved insofar as only one switching element is controlled and consequently only one control signal exists.

In this case, the diode 30' takes over the function of the second (in FIG. 3 right-hand) switching position, i.e. to conduct when the first (in FIG. 3 left-hand) current path of the switch 30 is switched off.

Any possibly non-negligible forward bias of the diode 30' polarized in the forward direction, for example, in the order of magnitude of about 0.2 volt in the case of a Schottky diode, leads to a correspondingly high voltage loss between the voltage at the node point N' and the operating voltage available to the light-emitting component 20.

However, since this voltage loss only occurs in that switching position which is intentionally assigned a reduced operating voltage at the light-emitting component 20, the voltage loss can be compensated by raising the voltage at the node point N.

In the circuit arrangement 100''' according to the fourth exemplary embodiment of the present invention illustrated by reference to FIG. 4A, an n-channel M[etal]O[xide]S[emiconductor]F[ield]E[ffect]T[ransistor] 30' is switched between the second node point N' and the second switching position of the switching element 30, having its drain connection D' connected to the second node point N', its gate connection G' connected to a supporting supply element 34, in particular to a supporting voltage source (for example, about 2.8 volt) and its source connection S' connected to the input connection of the light-emitting component 20.

In FIG. 4B the characteristic for the drain current $I_{D'}$ of this n-channel MOSFET 30' is plotted versus the gate source voltage $U_{G'S'}$ of this n-channel MOSFET 30' (=voltage measured from gate G' of the n-channel MOSFET 30' to source S' of the re-channel MOSFET 30'), wherein the current intensity $I_2$ assigned to the second switching position appears with an exemplary order of magnitude of about one milliampere at a gate source voltage $U_{G'S'}$ of, for example, about 0.6 volt.

In an alternative embodiment of the circuit arrangement 100''' according to the present invention illustrated by reference to FIG. 4C, the switching element is configured as two n-channel M[etal]O[xide]S[emiconductor]F[ield]E[ffect]T[ransistor]s 30 or 30', the respective drain connections D or D' being connected via the node N or N' to the first current source 10 or to the second current source 10', the gate connection G being connected to a control device 40, for example, in the form of a signal source or its gate connection G', via an optional resistance element 50 to a supporting supply element 34 or to a supporting voltage source 34 and the respective source connections S or S' being connected to one another and to the input connection of the light-emitting component 20.

In this case, in the variant of the circuit arrangement 100''' according to the present invention illustrated by reference to FIG. 4C, a regulating/processing element 22 in the form of a comparator or in the form of an amplifier is provided, its first input connection being connected to the second capacitively decoupled current source 10', its optional second input connection being connected to an optional reference voltage source 26 and its output connection being connected to the supporting supply element 34.

Although not explicitly shown in FIG. 4A, such a regulating/processing element 22 can also be provided in the circuit arrangement 100''' according to the fourth exemplary embodiment of the present invention illustrated by reference to FIG. 4A.

The comparator or amplifier 22 is configured to determine the voltage present at the node point N', to compare the determined voltage with the reference voltage Vref provided by the reference voltage source 26 and if necessary, to adjust or control the voltage of the supporting supply element 34, in particular to raise or lower this in such a manner that the voltage at the node point N' approaches the value of the reference voltage Vref.

In principle, the present invention can be configured in numerous ways; in particular, by adding additional components or additional elements in the signal and regulating paths, the present invention can be adapted to specific requirements.

As an example, attention may be drawn to the optional resistance element 50 in FIG. 4C which can be used for connecting the supporting supply element 34 to the gate connection G' of the transistor 30' in order to vary the ratio of gradients of the falling signal slope to the rising signal slope by inductive "peaking".

In this connection, attention may also be drawn to the fact that the term "connection" within the scope of the present invention also comprises connections or types of connection which are made by additionally inserted components or elements.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention.

LIST OF REFERENCE NUMERALS

100 circuit arrangement, in particular control circuit or driver circuit
(=first exemplary embodiment of the present invention; cf. FIG. 1)
100' circuit arrangement, in particular control circuit or driver circuit
(=second exemplary embodiment of the present invention; cf. FIG. 2)
100'' circuit arrangement, in particular control circuit or driver circuit
(=third exemplary embodiment of the present invention; cf. FIG. 3)
100''' circuit arrangement, in particular control circuit or driver circuit
(=fourth exemplary embodiment of the present invention; cf. FIG. 4)
10 first supply element, in particular first voltage source, for example first rechargeable battery unit, for supplying the circuit arrangement 100, 100', 100'' 100''' with voltage, in particular with direct voltage
10' second supply element, in particular second voltage source, for example second rechargeable battery unit, for supplying the circuit arrangement 100, 100', 100'', 100''' with voltage, in particular with direct voltage
12 decoupling capacitor, in particular capacitive support, of the first supply element 10
12' decoupling capacitor, in particular capacitive support, of the second supply element 10'
14 supply voltage, in particular Thévenin voltage, of the supply element 10, 10'
20 light-emitting component, in particular electro-optical transducer, for example light-emitting diode (=L[ight]E[mitting]D[iode]) or electroluminescent diode or laser, such as semiconductor laser
22 regulating and/or processing element, in particular comparator and/or amplifier, for example operation amplifier
26 reference voltage source
30 switching element, in particular closing switch or reversing switch or changeover switch, for example switching transistor, such as a M[etal]O[xide]S[emiconductor]F[ield]E[ffect]T[ransistor] or MOS transistor, for example n-channel F[ield]E[ffect]T[ransistor]
30' second component of the switching element 30, in particular diode polarized in the forward direction, in particular towards the switching element, for example pn diode or Schottky diode and/or switching transistor, such as M[etal]O[xide]S[emiconductor]F[ield]E[ffect]T[ransistor] or MOS transistor, for example n-channel F[ield]E[ffect]T[ransistor]
34 supporting supply element, in particular supporting voltage source, for the transistor 30'
40 control device, in particular signal source, of the transistor 30
50 resistance, in particular Ohmic resistance element
C capacitor
(=third example from the prior art; cf. FIG. 5C)
D drain connection of the transistor 30
D' drain connection of the transistor 30'
E light-emitting component, in particular electro-optical transducer, for example light-emitting diode (=L[ight]E[mitting]D[iode]) or electroluminescent diode or laser, such as semiconductor laser
(=examples from the prior art; cf. FIG. 5A, FIG. 5B, FIG. 5C)
G gate connection of the transistor 30
G' gate connection of the transistor 30'
K1 further circuit component, i.e. constant current source for $I_1$
(=examples from the prior art; cf. FIG. 5A, FIG. 5B, FIG. 5C)
K2 second further circuit component, i.e. constant current source for $I_2$
(=examples from the prior art; cf. FIG. 5A, FIG. 5B, FIG. 5C)
K2' third further circuit component, i.e. constant current source for $I_2/2$
(=third example from the prior art; cf. FIG. 5C)

L inductor
(=third example from the prior art; cf. FIG. 5C)
N first, in particular low-resistance node or node point between first supply element 10, first decoupling capacitor 12 and first switching position of the switching element 30
N' second, in particular low-resistance node or node point between first supply element 10, first decoupling capacitor 12 and first switching position of the switching element 30
Q voltage source, in particular rechargeable battery unit or accumulator
(=examples from the prior art; cf. FIG. 5A, FIG. 5B, FIG. 5C)
R dummy load
(=first example from the prior art; cf. FIG. 5A)
S source connection of the transistor 30
S' source connection of the transistor 30'
S1 circuit arrangement
(=first example from the prior art; cf. FIG. 5A)
S2 circuit arrangement
(=second example from the prior art; cf. FIG. 5B)
S3 circuit arrangement
(=third example from the prior art; cf. FIG. 5C)
T control device, in particular signal source, for controlling (the switching of) the switching element U, in particular closing switch control or reversing switch control or changeover switch control
(=examples from the prior art; cf. FIG. 5A, FIG. 5B, FIG. 5C)
U switching element, in particular closing switch or reversing switch or changeover switch
(=examples from the prior art; cf. FIG. 5A, FIG. 5B, FIG. 5C)
Vref reference voltage provided by reference voltage source 26 or reference voltage provided by reference voltage source 26
W reference potential, in particular earth potential or ground potential or zero potential

What is claimed is:
1. A circuit for controlling at least one light-emitting component, comprising:
   a) at least one supply element provided for supplying the circuit with voltage;
   b) at least one switching element provided, and being switchable at least between a first switching position and a second switching position;
   c) the at least one light-emitting component:
      i) is connected via the at least one switching element to a first node providing a first operating voltage for the at least one light-emitting component in the first switching position of the at least one switching element;
      ii) is connected to a second node providing a second operating voltage for the at least one light-emitting component in the second switching position of the at least one switching element while the first node is disconnected from the at least one light-emitting component; and
      iii) is controlled by switching the at least one light-emitting component mutually exclusively between at least the first node providing the first operating voltage and the second node providing the second operating voltage;
   d) the at least one supply element is configured as at least one current source supported by a decoupling capacitor between the output side of the at least one current source and a reference potential;
   e) the at least one supply element includes a first supply element and a second supply element which are connected to one another in parallel, and each configured as a current source supported by a decoupling capacitor on the output side;
   f) a transistor is connected between at least one of the first supply element and the second supply element and the at least one switching element;
   g) a drain connection of said transistor being connected to the first supply element or to the second supply element;
   h) a gate connection of said transistor being connected to at least one supporting supply element; and
   i) a source connection of said transistor being connected to the input connection of the at least one light-emitting component.

2. The circuit according to claim 1, wherein:
   a) the at least one light-emitting component is configured as at least one electro-optical transducer.

3. The circuit according to claim 1, wherein:
   a) the transistor is configured as at least one M[etal] O[xide] S[emiconductor] F[ield] E[ffect] T[ransistor] or as at least one MOS transistor.

4. A circuit for controlling at least one light-emitting component, comprising:
   a) at least one supply element provided for supplying the circuit with voltage;
   b) at least one switching element provided, and being switchable at least between a first switching position and a second switching position;
   c) the at least one light-emitting component:
      i) is connected via the at least one switching element to a first node providing a first operating voltage for the at least one light-emitting component in the first switching position of the at least one switching element;
      ii) is connected to a second node providing a second operating voltage for the at least one light-emitting component in the second switching position of the at least one switching element while the first node is disconnected from the at least one light-emitting component; and
      iii) is controlled by switching the at least one light-emitting component mutually exclusively between at least the first node providing the first operating voltage and the second node providing the second operating voltage;
   d) the at least one supply element is configured as at least one current source supported by a decoupling capacitor between the output side of the at least one current source and a reference potential;
   e) the at least one supply element includes a first supply element and a second supply element which are connected to one another in parallel, and each configured as a current source supported by a decoupling capacitor on the output side;
   f) the at least one switching element is configured as at least two transistors;
   g) a respective drain connection of said at least two transistors being connected to the first supply element or to the second supply element;
   h) a respective gate connection of said at least two transistors being connected to at least one control device or to at least one supporting supply element; and
   i) a respective source connection of said at least two transistors being connected to one another and to the input connection of the at least one light-emitting component.

5. The circuit according to claim 4, wherein:
   a) the at least one light-emitting component is configured as at least one electro-optical transducer.

6. The circuit according to claim 4, wherein:
a) at least one regulating and/or processing element is provided:
b) the input connection thereof is connected to the second supply element; and
c) the output connection whereof is connected to the supporting supply element.

7. A circuit for controlling at least one light-emitting component, comprising:
a) at least one supply element provided for supplying the circuit with voltage, the at least one supply element includes a first supply element and a second supply element;
b) at least one switching element provided, and being switchable at least between a first switching position and a second switching position; and
c) the at least one light-emitting component:
   i) is connected via the at least one switching element to a first node providing a first operating voltage for the at least one light-emitting component in the first switching position of the at least one switching element;
   ii) is connected to a second node providing a second operating voltage for the at least one light-emitting component in the second switching position of the at least one switching element while the first node is disconnected from the at least one light-emitting component; and
   iii) is controlled by switching the at least one light-emitting component mutually exclusively between at least the first node providing the first operating voltage and the second node providing the second operating voltage;
d) a transistor is connected between at least one of the first and second supply elements and the at least one switching element;
e) a drain connection of said transistor being connected to the first supply element or to the second supply element;
f) a gate connection of said transistor being connected to at least one supporting supply element;
g) a source connection of said transistor being connected to the input connection of the at least one light-emitting component; and
h) the first supply element and the second supply element being connected to one another in parallel, each configured as a current source supported by a decoupling capacitor on the output side.

8. A circuit for controlling at least one light-emitting component, comprising:
a) at least one supply element provided for supplying the circuit with voltage, the at least one supply element includes a first supply element and a second supply element;
b) at least one switching element provided, and being switchable at least between a first switching position and a second switching position; and
c) the at least one light-emitting component:
   i) is connected via the at least one switching element to a first node providing a first operating voltage for the at least one light-emitting component in the first switching position of the at least one switching element;
   ii) is connected to a second node providing a second operating voltage for the at least one light-emitting component in the second switching position of the at least one switching element while the first node is disconnected from the at least one light-emitting component; and
   iii) is controlled by switching the at least one light-emitting component mutually exclusively between at least the first node providing the first operating voltage and the second node providing the second operating voltage;
d) the at least one switching element is configured as at least two transistors;
e) a respective drain connection of said at least two transistors being connected to the first supply element or to the second supply element;
f) a respective gate connection of said at least two transistors being connected to at least one control device or to at least one supporting supply element;
g) a respective source connection of said at least two transistors being connected to one another and to the input connection of the at least one light-emitting component; and
h) the first supply element and the second supply element being connected to one another in parallel, each configured as a current source supported by a decoupling capacitor on the output side.

* * * * *